United States Patent [19]

Makhijani et al.

[11] 3,915,784

[45] Oct. 28, 1975

[54] METHOD OF SEMICONDUCTOR CHIP SEPARATION

[75] Inventors: Manik P. Makhijani; Frank Scacciaferro, both of Wappingers Falls; Carl Yakubowski, Poughkeepsie, all of N.Y.

[73] Assignee: International Business Machines Corporation, Armonk, N.Y.

[22] Filed: Apr. 26, 1972

[21] Appl. No.: 247,639

[52] U.S. Cl. ...................... 156/344; 134/1; 134/34; 156/584

[51] Int. Cl.[2] ........................ B01F 1/00; B28D 5/00

[58] Field of Search ........... 156/344, 323, 289, 247, 156/248, 250, 155; 29/583, 412, 413; 81/108, 906; 209/74, 45, 81; 134/1, 34

[56] References Cited

UNITED STATES PATENTS

| | | | |
|---|---|---|---|
| 3,454,428 | 7/1969 | Hittel et al. | 134/1 |
| 3,584,741 | 6/1971 | Schirmer | 209/81 R |
| 3,627,124 | 12/1971 | Hance et al. | 324/158 F |
| 3,632,074 | 1/1972 | Wanesky | 248/346 |
| 3,663,326 | 5/1972 | Wanesky | 156/3 |
| 3,666,588 | 5/1972 | Wanesky | 156/155 |
| 3,681,139 | 8/1972 | Jannett et al. | 156/344 |
| 3,687,369 | 8/1972 | Johnstone | 134/1 |
| 3,690,984 | 9/1972 | Wanesky | 156/235 |

*Primary Examiner*—Douglas J. Drummond
*Assistant Examiner*—F. Frisenda
*Attorney, Agent, or Firm*—William J. Dick

[57] ABSTRACT

Disclosed is a method and apparatus for separating discrete chips of a diced semiconductor wafer without disturbing the orientation of the chips, the chips being bonded to a support or substrate from which they must be separated prior to use. The substrate is first positioned in a fixture so that the diced wafer assumes a predetermined orientation, and then a resilient foraminous pad is pressed against the chips, and a bond releasing fluid is urged, by a novel pump, through the pad until the chips are released from their support, the thickness of the removed bond being compensated for by expansion of the pad. Also disclosed is a fixture which acts as a convenient storage tray for the chips in their original orientation.

4 Claims, 19 Drawing Figures

METHOD OF SEMICONDUCTOR CHIP SEPARATION

SUMMARY OF THE INVENTION AND STATE OF THE PRIOR ART

The present invention relates to a method for separating discrete chips of a diced semiconductor wafer, and more particularly relates to a method for such separation without disturbing the orientation of the chips, the chips being bonded to a support from which they must be separated prior to use.

In the manufacture of integrated circuits, it is common practice to reproduce the design of the circuit as well as active and passive devices on a silicon wafer, the wafer having anywhere from 200 to 1,000 discrete duplications of the particular device or circuit desired impressed therein. After the processing is completed, the wafer is then diced by either a laser, slurry type saw or band saw so as to separate the circuits or components into discrete chips, the chips then being bonded in one fashion or another to a substrate for mounting on a card and then placed into the equipment for which it was designed. During the dicing operation it is conventional practice, to prevent the semiconductor wafer from moving while the cutting of the wafer is being effected, to bond the wafer to a substrate, such as a phenolic block, with a releasable bonding agent such as glycol pthallate and, after dicing, to immerse the block into a solvent (such as methylene chloride) which may be agitated to release the chips from the substrate. Thereafter the chips are removed and placed in a vial, box or other container and subsequently oriented at a placement machine and the like for placement onto a ceramic substrate, circuit card, etc.

It has been discovered that the mere pouring of the chips one on top of the other in a container may result in damage to the surface of individual discrete chips, in certain instances destroying and making bad product due to edge contact of one chip against the surface of another chip. With relatively simple circuits or discrete device chips the economic loss is insignificant as compared with the total number of chips in a wafer. However, with the increase in the number of circuits on a chip, and an increase in the size of a chip, as well as an increase in the number of processing steps to fabricate that chip, the loss of a single chip becomes significant. Accordingly, with new test machines it has been found easier to test the chips prior to dicing the wafer which results in a test "map" which indicates the good and bad product sites or chips on a particular wafer. Accordingly, it is desirable to avoid the damage by pouring chips one on top of the other and to retain their initial orientation as well as position (relative to such test maps) so that good product may be segregated by the use of the test map from bad product.

The present invention discloses a method of separating the discrete chips of a diced semiconductor wafer without disturbing their orientation by positioning the substrate to which the chips are bonded in a fixture, biasing a support or cover member against the semiconductor chips and destroying the bond between the chips and the substrate whereupon the support or cover member urges the chips against the substrate thereby retaining the chips in their initial position.

In view of the above, it is an object of the present invention to provide a method of separating the chips of a diced semiconductor wafer from the substrate to which they are bonded without altering their relative position one to the other or their orientation.

Another object of the present invention is to provide a method for separating semiconductor chips from a support to which they are bonded by urging a solvent intermediate adjacent chips while the chips are being held in position to dissolve the bond between the chips and its work supporting member or substrate.

Still another object of the present invention is to provide a method of holding the chips in a fixed position after the bond has been removed from between the chips and the substrate.

Other objects and a more complete understanding of the invention may be obtained by referring to the following specification and claims taken in conjunction with the accompanying drawings in which:

Figures 1, 2, 3:
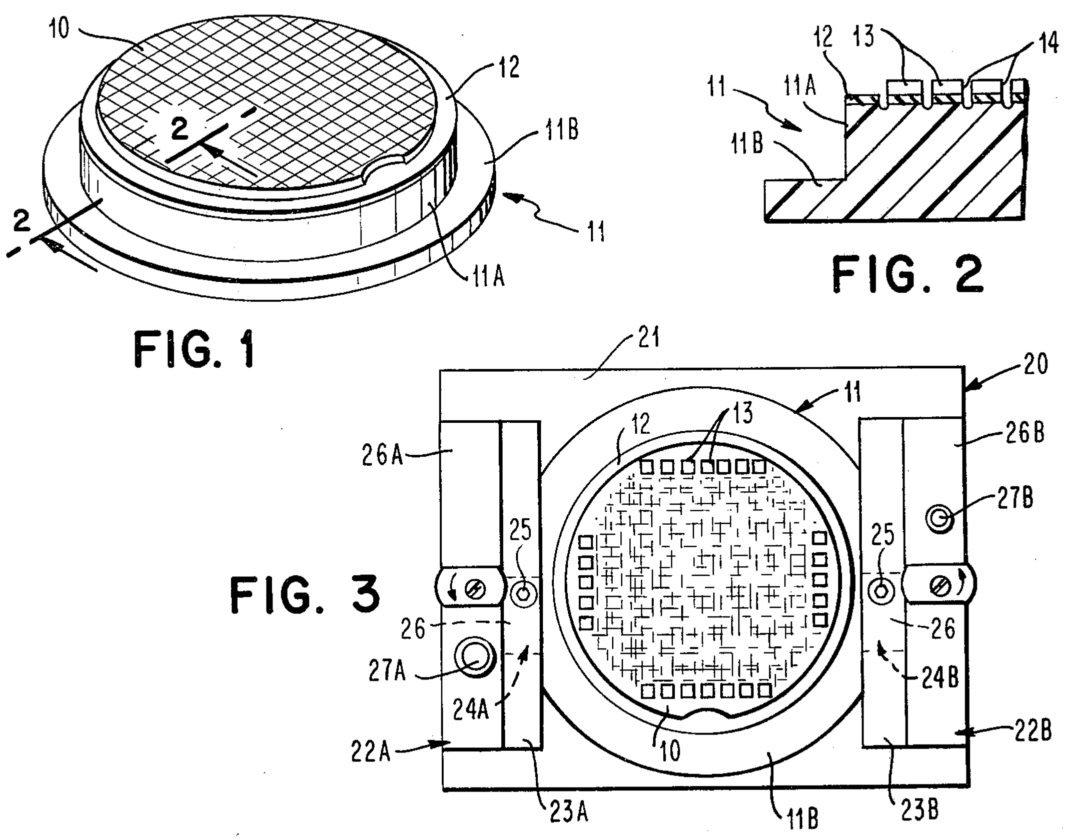
FIG. 1 is a perspective view of a typical semiconductor wafer (post dicing) bonded to a substrate or support.
FIG. 2 is an enlarged fragmentary sectional view taken along line 2—2 of FIG. 1.
FIG. 3 is a plan view of the wafer and support in position in a first fixture.
Figure 4:
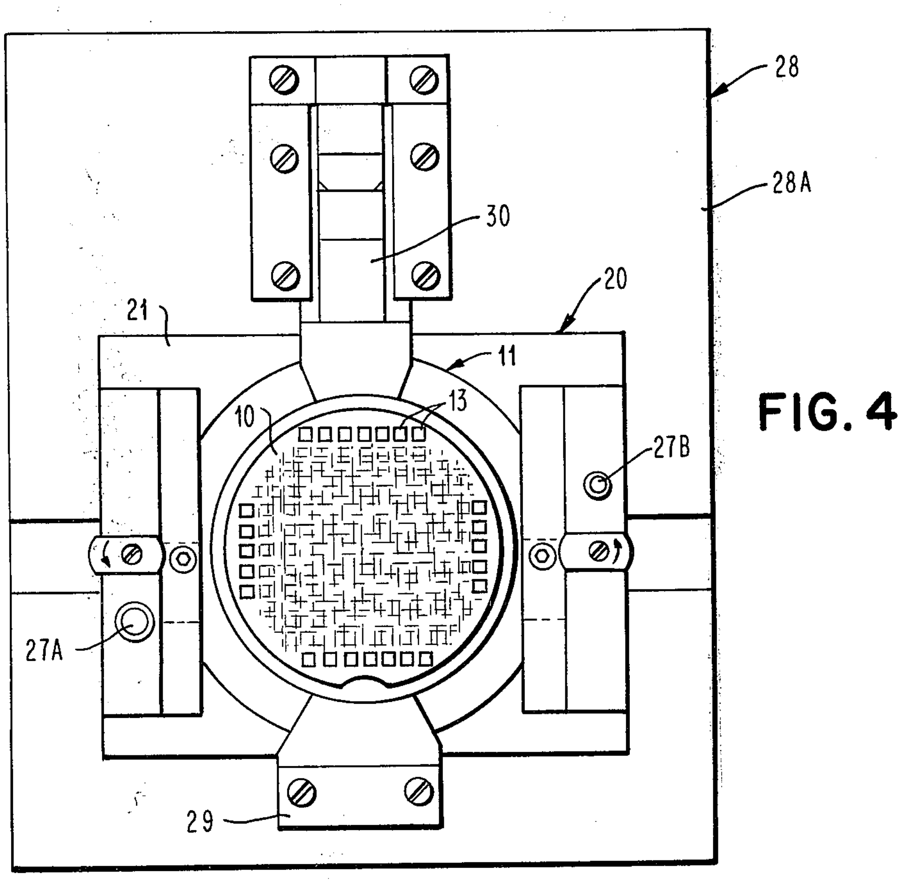
FIG. 4 is a plan view of the first fixture mounted on a second fixture for adjusting the position of the substrate and wafer relative to the first fixture.

Referring to the drawings and especially FIG. 1 thereof, a semiconductor wafer 10 which was first bonded to a substrate or support 11 by a releasable or destroyable bond 12, such as glycol pthallate, and then diced to form discrete chips 13, is shown therein. In the illustrated instance, the support or substrate 11 includes a pedestal portion 11A and a peripherally extending flange portion 11B which circumscribes the pedestal 11A. Dicing of semiconductor wafers is relatively well-known art and may be accomplished in any number of ways including a slurry saw, laser, etc. but in each instance the cut creates a kerf area 14 which extends down into the bond 12, and in many instances into the substrate 11.

Figure 10:
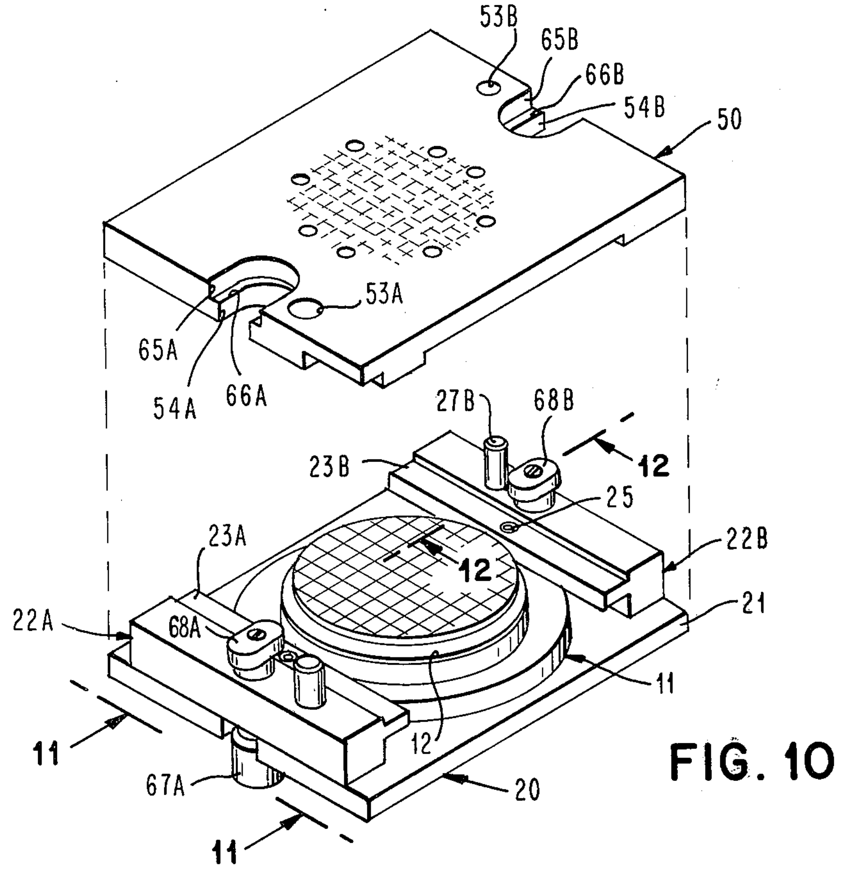
FIG. 10 is a perspective view illustrating the placement of the cover onto the fixture.
Figure 11:
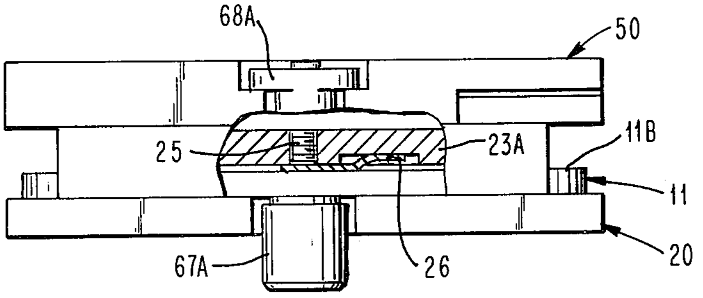
FIG. 11 is an enlarged fragmentary side elevational view as viewed along line 11—11 of FIG. 10 and illustrating the placement of the cover member in relation to the fixture.
Figures 13, 14, 15, 16:
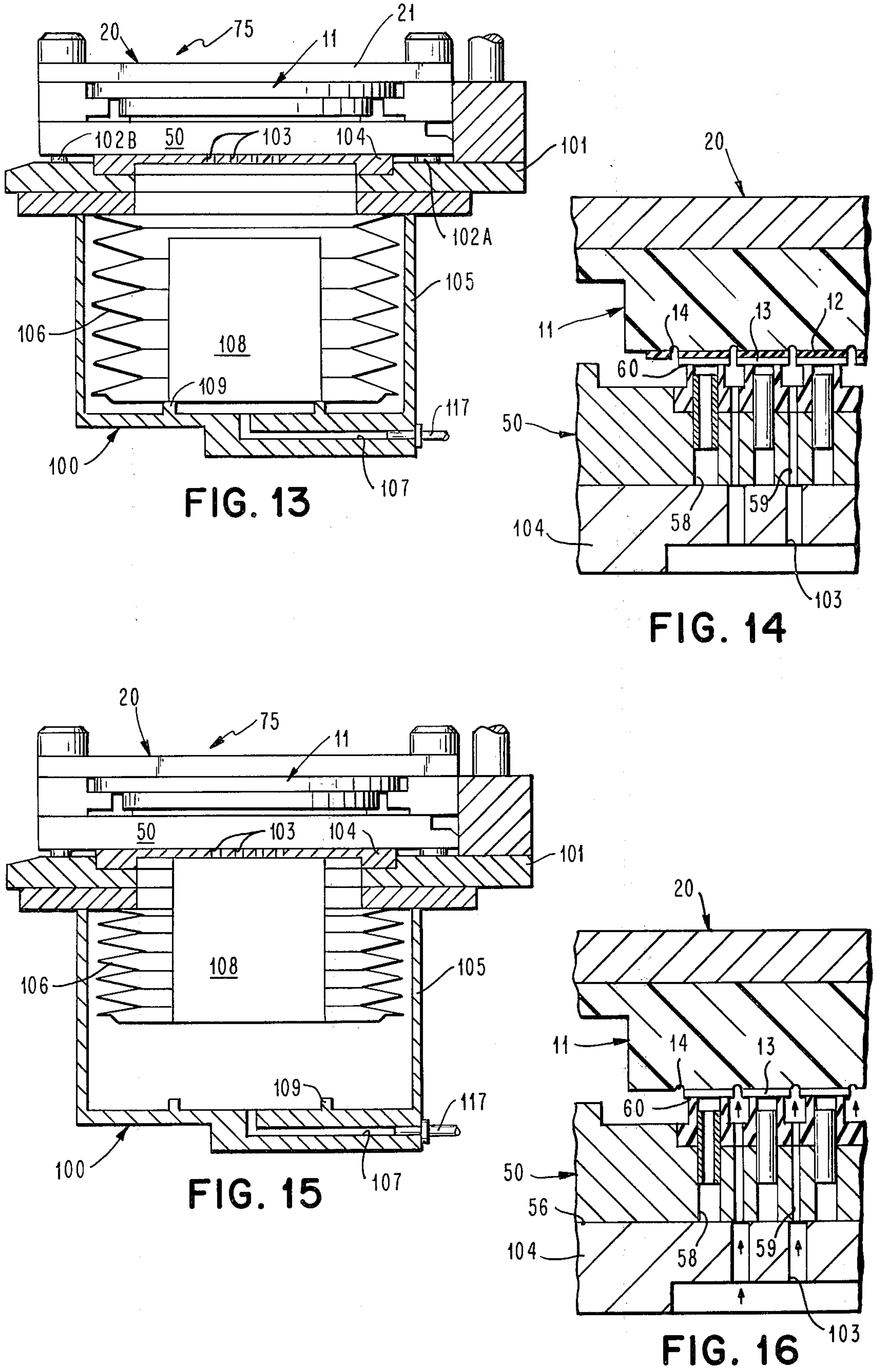
FIG. 13 is a fragmentary side elevational view of the fixture and cover member positioned upon a novel pump for urging a bond destroying liquid intermediate the chips and substrate.
FIG. 14 is an enlarged fragmentary sectional view of a portion of the jig and pump illustrated in FIG. 13.
FIG. 15 is a view of the apparatus similar to that illustrated in FIG. 13 but with the pump in an "end of stroke" condition.
FIG. 16 is an enlarged fragmentary sectional view similar to the structure shown in FIG. 14 except illustrating the position of the various parts of the structure with the bonding material removed.

In accordance with the invention, the method of separating chips 13 of the diced semiconductor wafer 10 without disturbing their orientation includes the steps of: positioning the support or substrate 11 in a fixture 20 (FIG. 3), biasing a support or cover member 50 (FIG. 10) against the semiconductor chips and destroying the bond between the chips and the support as by a pump or the like 100 (FIG. 13) so that the support member 50 urges the chips against the substrate 11. To this end and referring first to FIGS. 3 and 10, a fixture 20 includes a base 21, and a pair of upstanding, spaced apart side walls 22A, 22B including inwardly projecting ledge portions 23A, 23B which are adapted to overlie the flange 11B of the substrate 11, while permitting limited movement of the substrate for orientation purposes. As best illustrated in FIGS. 3, 10 and 11, each of the ledges includes a clamp 24A, 24B to secure the substrate, once oriented, to the base 21 of the fixture 20. As illustrated in FIG. 11, the clamp includes a simple set screw or the like 25 which presses a leaf 26 connected to the ledge, onto the flange 11B. Projecting from the upper surface 26A and 26B of the upstanding side walls 22A and 22B are dowels 27A and 27B, the dowels preferably being of a different diameter, for purposes which will become more evident hereinafter.

In order to precisely orient the chips 13 on the substrate 11, relative to the fixture 20, the fixture 20 is mounted on a second fixture 28 which clamps the substrate 11 and permits movement of the fixture relative to the substrate to precisely align the chips relative to the dowels 27A, 27B. To this end, the second fixture 28 includes a fixed clamp 29 and a spring bias clamp 30 which are spaced apart on a base plate 28A. The clamps serve to fix the substrate relative to the second fixture 28 while permitting movement of the fixture 20 about the substrate.

Figure 5:
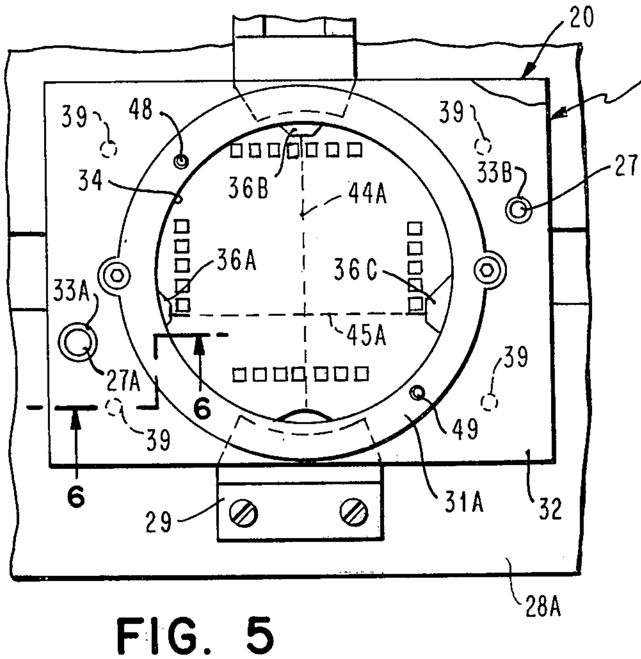
FIG. 5 is a plan view of a jig utilized in conjunction with the second fixture to accurately position the diced wafer relative to the first fixture.

In order to effect the proper orientation of the substrate or chips thereon relative to the fixture 20, a jig 31 (FIG. 5) is placed on the dowels 27A, 27B of the fixture 20 and with suitable alignment means on the jig, permits proper registration and alignment of the substrate and thus the chips relative to the fixture 20. To this end, and referring now to FIG. 5, the jig 31 comprises a plate 32 having apertures 33A and 33B therein which register with the dowels 27A, 27B respectively of the fixture 20. The jig is provided with a central bore 34 approximating the diameter of the diced semiconductor wafer. Depending from an annular recess 35 extending radially outward from the bore 34 are alignment means 36 (see FIG. 6) which includes a support 37 and a depending knife edge 38 which project into the bore 34. As shown in FIG. 5, there are three such depending alignment means 36A, 36B and 36C, the blades associated with each being adapted to align with a predetermined chip kerf area (see kerf 14 in FIG. 2) when the fixture 20 is in proper alignment with the substrate 11.

Figure 6:
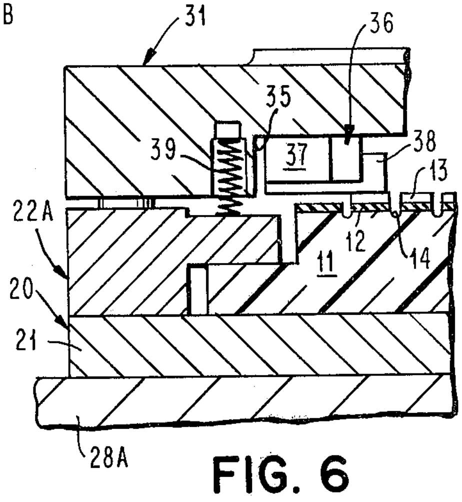
FIG. 6 is an enlarged fragmentary sectional view taken along line 6—6 of FIG. 5.

In order to permit movement of the fixture 20 and jig 31 relative to the substrate, the jig 31 is biased upwardly as by biasing springs 39 which serve to elevate the blades 38 slightly above the level of the chips 13 (FIG. 6). As shown in dotted lines in FIG. 5, there are four such biasing springs.

After the alignment has been effected by the jig 31 in association with the knife blades 38, the substrate is clamped to the fixture 20 as by the clamps 24A, 24B, heretofore described relative to FIGS. 3 and 11, and the jig 31 is then removed.

Figure 7:
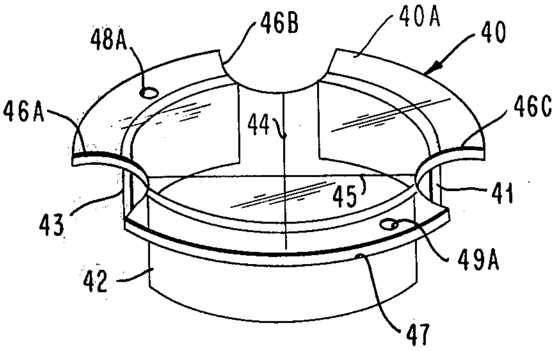
FIG. 7 is a perspective view of a special insert into the jig illustrated in FIGS. 5 and 6 for aligning the chips (and substrate) in a predetermined position when chips are missing from the substrate.

In certain instances where the wafer has been broken and a portion of the chips are not present on the substrate 11, alignment by the knife blades 38 of the alignment means 38 is difficult, if not impossible. To align the remaining chips bonded on the substrate 11, a secondary alignment means 40 having inwardly projecting depending legs 41, 42 and 43 and cross hairs 44 and 45 in a transparent cover 40A, is shown in FIG. 7. A pair of dowels 48 and 49 (FIG. 5) projecting from a raised annulus 31A circumscribing the bore 34, fit into apertures 48A, 49A respectively contained in a lip 47 of the cover 40A. Recesses 46A, 46B, and 46C accommodate the inwardly projecting first alignment support means 36A, 36B, and 36C. When in use, the legs 41–43 are inserted in the bore 34 and the fixture 20 is moved relative to the substrate 11 until the cross hairs are in the proper position relative to the remaining chips bonded to the substrate, the dotted lines 44A, 45A corresponding to the position of the cross hairs 44 and 45 on the alignment means 40 (FIG. 5). If parallax is a problem, the means 40 may be made so the cross hairs are disposed closely adjacent the wafer. This may be accomplished, for example, by fabricating the alignment means from a solid piece of clear acrylic plastic and disposing the cross hairs on the lower portion thereof adjacent the wafer.

After alignment is completed, either of a complete or partial semiconductor wafer and as heretofore described, the substrate 11 is clamped by the clamps 24A, 24B to the base 21 of the fixture 20, and the jig 31 is then removed. The fixture 20 is then removed from the second fixture 28 by releasing the clamp 30.

Figure 9:
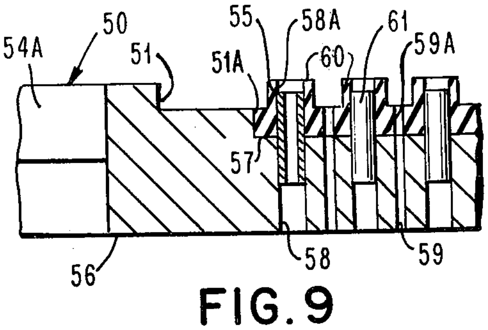
FIG. 9 is an enlarged fragmentary sectional view taken along line 9—9 of FIG. 8.

Thereafter, the support or cover member 50 is biased against the chips 13 and clamped to the fixture 20 for destroying the bond 12 between the chips 13 and substrate 11. To this end, the cover member 50 comprises a plate including a double or stepped annular recessed portions 51 and 51A. Inserted into the recess 51A is a resilient foraminous pad 55. The diameter of the second recess 51A, and thus of the pad 55, is approximately the same as the diameter of the semiconductor wafer 10. Extending from the lower surface 56 of the cover to the upper surface 57 of the recess 51A are two groups of apertures, 58 and 59, the apertures having extensions through the pad 55 as indicated at 58A, 59A (FIG. 9). As shown, the apertures of the group 58A terminate in projections or nipples 60, the spacing of the nipples corresponding to the distance from chip to chip. Intermediate adjacent nipples and recessed from the upwardly projecting terminal ends thereof so as to be aligned with the kerf 14 between the chips, lie the group of apertures designated 59, 59A. Tubular stiffeners 61 extend through at least some of the apertures 58 in the cover 50 into the apertures 58A of the pad 55, the terminal ends of the stiffeners being spaced from the terminal ends of the projections or nipples 60.

In order to position the cover 50 so that the nipples 60 of the pad 55 engage each of the chips, the cover includes dowel apertures 53A, 53B which register with the dowels 27A, 27B of the fixture 20. In order to bias the nipples against the chips, (the nipples being under a slight compressive deformation) the cover 50 must be clamped to the fixture 20. To this end, a pair of recesses 54A, 54B extending inwardly from opposite longitudinal ends 50A, 50B of the support cover 50 and including a recessed portion 65A, 65B and ledge 66A, 66B, serves to receive a twist lock 67A, 67B, extending through upstanding side walls 22B 22b of the fixture 20. Simple rotation of the locks 67A and 67B effects rotation of catches 68A, 68B associated with the locks to grip the ledges 66A, 66B of the cover member 50 thereby biasing the nipples and causing a slight compression of the same against chips bonded to the substrate. (See FIGS. 11 and 12 for the position of the cover 50 relative to the fixture 20 and the position of the nipples 60 of the pad 55 relative to the chips 13.)

Figure 8:
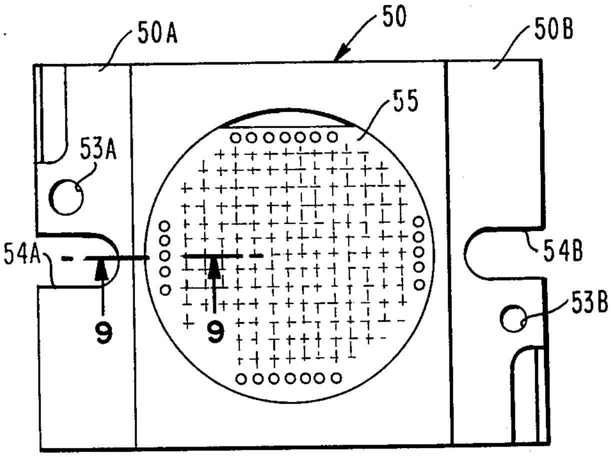
FIG. 8 is a plan view of a supporter cover member to be placed over the first fixture.
Figure 12:
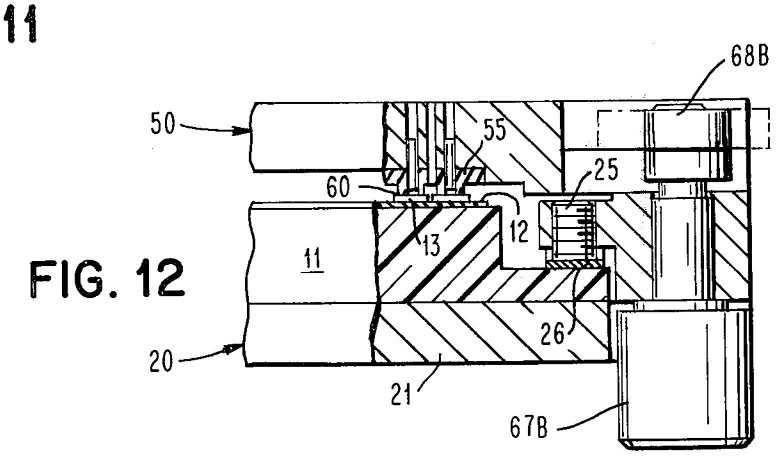
FIG. 12 is an enlarged fragmentary sectional view taken along line 12—12 of FIG. 10.

After the fixture 20 and cover 50 are locked in position as shown in FIGS. 11 and 12, a bond destroying or releasing fluid may be forced against the bond material 12 causing the bond material to be removed from between the chip 13 and the substrate 11, the nipples 60, having been compressed slightly, taking up the slack as the bonding material is eroded or dissolved away. To this end and referring first to FIG. 13, the assembly 75, which comprises the fixture 20 and cover 50 between which is sandwiched the substrate 11 and chips 13, is fixed or aligned onto a bed plate 101 as by upstanding dowels 102A and 102B. The dowels engage the dowel holes 53A, 53B (see FIGS. 8 and 10) of the cover 50 so that the assembly is now aligned relative to the bed plate 101. Registering with the group of apertures 59 (see FIG. 14) in the lower surface 56 of the cover 50 are apertures of a group 103 located in an insert 104 in the bed plate 101. As may be seen in FIG. 14, the group of apertures 58 in the cover 50 are blocked by the insert 104.

In order to effect a flow of bond destroying medium through the group of apertures 59 and 103, aligned with the kerf 14 of the chips 13, a pump 100 forces liquid through the apertures intermediate the nipples and against the bond dissolving the bond. As illustrated, the pump includes a receiver 105 which is connected to the bed plate 101 and in which is mounted for reciprocation a bellows 106, also supported from the bed plate 101. At the bottom of the receiver is a conduit 107 which permits the entry of a suitable medium, either gas or liquid, in the present instance air, to the interior of the receiver to effect reciprocation of the bellows 106. If the interior of the bellows is filled with a bond releasing or destroying medium (in the instance of glycol pthallate, acetone) upward movement of the bellows into the position shown in FIG. 15 will force liquid through the apertures 103 and 59 against the bond destroying the same. At that point in time a vacuum is drawn beneath the bellows through the conduit 107 and the bellows retracts. If the assembly and pump, therefore, are positioned in a tank of the solvent, such as the tank 110 illustrated in FIG. 17, the downward movement of the bellows 106 will cause the fluid to be drawn back through the fixture, downwardly through the apertures 59, 103 and back into the bellows 106. It has been found that the oscillating action of the fluid speeds up the destroying of the bond material. To increase the life of the bellows 106, a mechanical stop 108 is located in the bellows, the upward movement of the bellows thereby being restricted upon the stop 108 engaging the lower surface of the insert 104. The lower stroke or bottoming stroke of the bellows 106, in a like manner, is restricted by upstanding projections 109 which extend from the lower wall of the receiver 105.

As the bond is removed, the nipples extend themselves until the back side of the chip 13 engages the substrate 11 and the assembly may then be removed.

Figure 17:
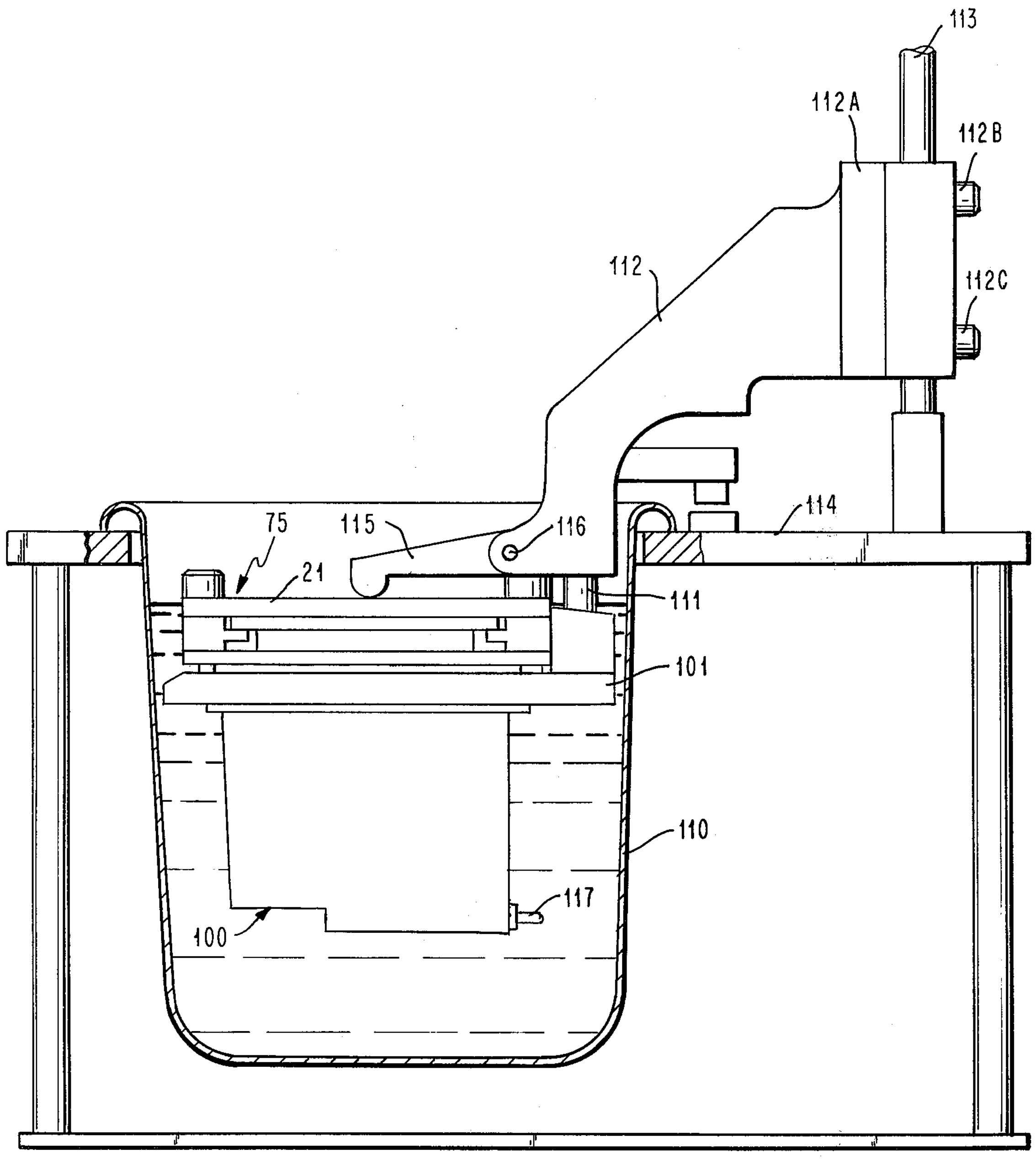
FIG. 17 is a fragmentary sectional side elevational view illustrating the position of the pump relative to the fixture as the bond is being destroyed.
Figure 18:
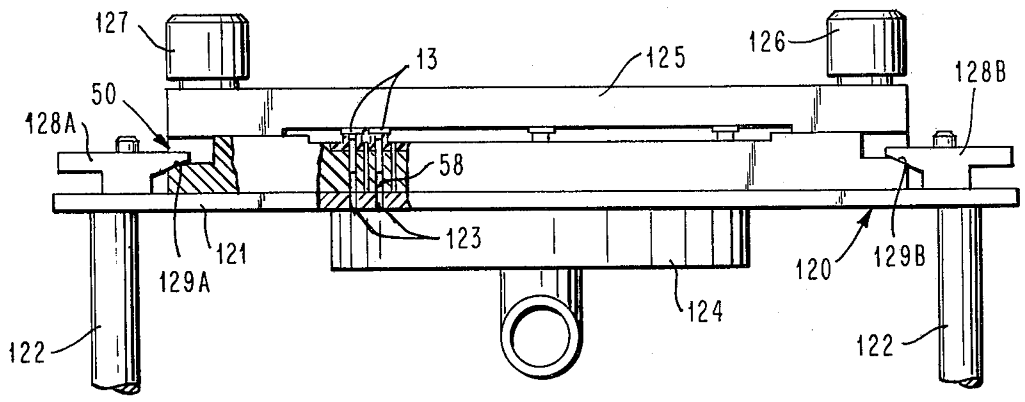
FIG. 18 is a fragmentary side elevational view illustrating the fixture for removing the substrate or support upon which chips were mounted.

In order to prevent displacement of the assembly 75 when oscillating liquid through the apertures 103 of the insert 104, it is desirable to clamp the assembly to the pump 100 until the solvent has released the bond. While this may be accomplished in any number of ways one such scheme is illustrated in FIG. 17 wherein the pump 100 and assembly 75 is suspended in a tank 110 of the bond releasing liquid. Suspension of the assembly in the tank 110 is effected by a post 111 extending upwardly from the bed plate 101 and supported by an arm 112 mounted for vertical sliding motion on a column 113. As shown the column 113 is mounted on a stand 114 in which is suspended the tank 110. The arm in turn contains a locking lever 115 pivoted as at 116 to apply pressure against the back of the base 21 of fixture 20. An air line 117 extends into the tank and is connected to the conduit 107 to provide the necessary positive and negative pressures to the bellows 106 to effect the pumping action.

After the bond has been destroyed, the locking screws 112B and 112C may be loosened so as to permit the collar 112A, which is connected to the arm 112, to move upwardly on the column 113 thereby lifting the pump and assembly 75 clear of the tank 110. The locking arm 115 may then be released and the assembly 75 removed.

Figure 19:
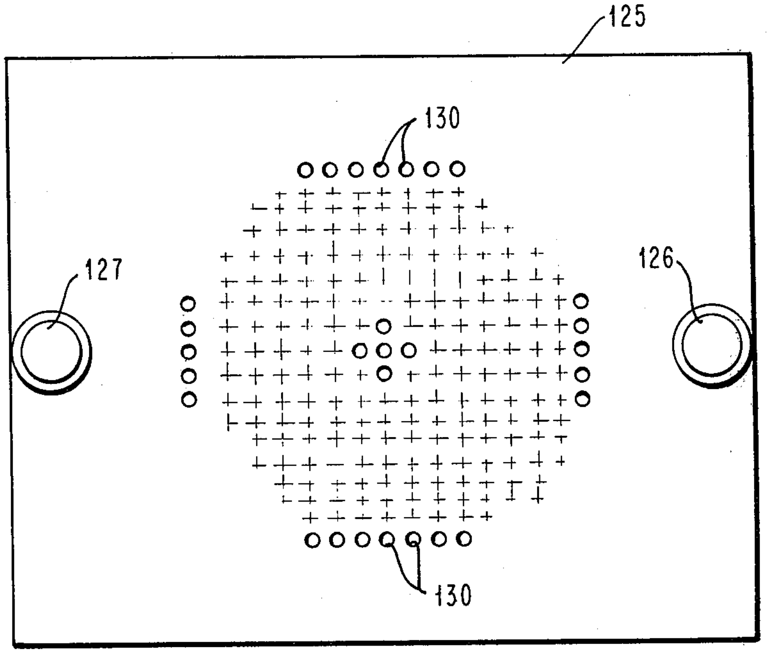
FIG. 19 is a plan view of the package in which the chips may be stored and illustrating the ability to hold the chips against either the upper or lower cover.

Inasmuch as the chips are now free from the substrate 11, it is desirable to remove the substrate. To this end, the assembly 75 may be placed on a third fixture 120 which includes a plate 121 mounted on legs 122, the plate having dowels or the like (not shown) for registry with the dowel holes 53A, 53B in the support member or cover 50. Additionally, clamps 128A and 128B may be connected to the plate 121 to engage recessed depressions 129A and 129B respectively in the cover 50. The plate 121, however, has a group of apertures 123 which register with the group of apertures 58 aligned with the chips 13, while blocking off the passages 59 intermediate the chips. By drawing a vacuum through a manifold arrangement 124, the chips are held in the initial orientation the position on the ends of the nipples. The twist locks 67A and 67B may then be rotated and the fixture 20, with the substrate 11 removed. Thereafter, a cover 125 may be positioned over the chips, the cover having a twist lock 126 and 127 identical to the twist lock 67A and 67B heretofore described relative to fixture 20. As illustrated in FIG. 19, the cover 125 may include a plurality of apertures 130 which are aligned with the opposite side or back side of the chips. The apertures serve to prevent surface tension from holding the chips to the cover when removing the cover 125 from the chips. Additionally, the surface of the cover, in registry with the chips, may include a serrated, or cross hatch, or ridged surface to further prevent surface tension gripping of the chips when the cover is removed.

In the event that it is desired to pick up the chips from the front side, as opposed to the back side for placement on circuit cards, ceramic substrates, etc., it may be desirable to use a cover identical to the cover 50 including a pad similar to the pad 51. In this way the vacuum may be drawn through the apertures 130 as opposed to the apertures 58.

Thus the present invention describes a method of separating discrete chips of a diced semiconductor wafer without disturbing the orientation by positioning the support to which the chips are bonded, pressing a resilient pad against the semiconductor chips and urging a bond releasing fluid through the pad until the chips are released from the supporting substrate.

Although the invention has been described with a certain degree of particularity, it is understood that the present disclosure has been made only by way of example and that numerous changes in the method of operation may be made without departing from the spirit and the scope of the invention as hereinafter claimed.

What is claimed is:

1. A method of separating discrete chips of a diced semiconductor wafer from a substrate to which they are bonded by a fluid releasable bond without disturbing the orientation of said chips, said chips having open spaces therebetween defining a kerf area, comprising the steps of: placing a resilient pad against said semiconductor chips, said pad having two sets of apertures therein, one set aligned with said chips and a second set aligned with said kerf areas, placing said substrate and pad in a container of bond releasing fluid and effecting an oscillatory pumping of said bond releasing fluid through at least said second set of apertures against said bond until said bond is destroyed.

2. A method of separating discrete chips of a diced semiconductor wafer without disturbing their orientation, said chips being bonded to a substrate, comprising the steps of: positioning said substrate in a fixture; orienting said substrate to align said chips in a predetermined orientation; clamping said substrate in said predetermined orientation; compressing a resilient pad having a first group of apertures aligned with said chips and a second group of apertures intermediate said chips, against said chips and clamping said pad relative to said chips to form an assembly with said fixture; positioning said assembly in registry with the output of a pump, submerging said assembly in a container of bond releasing medium and effecting, by said pump, an oscillation of said bond destroying medium through said second group of apertures until said bond is destroyed.

3. A method in accordance with claim 2 including the steps of: removing said assembly from said tank, drawing a vacuum on said first group of apertures to hold said chips in position on said pad, and removing said substrate while maintaining a vacuum.

4. A method in accordance with claim 3 including the step of clamping a cover over said chips.

* * * * *